US009257473B2

(12) United States Patent
Maeda

(10) Patent No.: US 9,257,473 B2
(45) Date of Patent: Feb. 9, 2016

(54) SOLID-STATE IMAGING DEVICE

(71) Applicant: Kabushiki Kaisha Toshiba, Minato-ku (JP)

(72) Inventor: Motohiro Maeda, Oita (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/729,175

(22) Filed: Jun. 3, 2015

(65) Prior Publication Data

US 2016/0013237 A1 Jan. 14, 2016

(30) Foreign Application Priority Data

Jul. 10, 2014 (JP) ................. 2014-142397

(51) Int. Cl.
*H01L 27/148* (2006.01)
*H01L 27/146* (2006.01)

(52) U.S. Cl.
CPC ...... *H01L 27/14638* (2013.01); *H01L 27/1464* (2013.01); *H01L 27/14614* (2013.01)

(58) Field of Classification Search
CPC ............ H01L 27/14603; H01L 27/14643; H01L 27/14607; H01L 27/14625; H01L 27/14614; H01L 27/14638; H01L 27/14665; H01L 27/148
See application file for complete search history.

(56) References Cited

U.S. PATENT DOCUMENTS

| 5,438,211 | A | * | 8/1995 | Nakamura et al. ................. H01L 29/76841 257/223 |
| 8,031,250 | B2 | * | 10/2011 | Yamashita ............. H04N 3/155 348/294 |
| 2009/0101796 | A1 | * | 4/2009 | Ladd et al. ............. H04N 5/235 250/206 |
| 2011/0164162 | A1 | * | 7/2011 | Kato .................. H04N 5/37213 348/311 |
| 2012/0242875 | A1 | | 9/2012 | Nakamura |

FOREIGN PATENT DOCUMENTS

| JP | 2000-124437 | 4/2000 |
| JP | 2012-199489 | 10/2012 |
| JP | 2013-26264 | 2/2013 |

* cited by examiner

Primary Examiner — Thomas L Dickey
Assistant Examiner — Gustavo Ramallo
(74) *Attorney, Agent, or Firm* — Oblon, McClelland, Maier & Neustadt, L.L.P.

(57) ABSTRACT

According to one embodiment, a solid-state imaging device is provided which comprises a floating diffusion, a transfer gate, and a photoelectric conversion element. The floating diffusion is provided in a surface of a semiconductor layer. The transfer gate extends inward from the surface of the semiconductor layer and bends in the semiconductor layer toward the floating diffusion side. The photoelectric conversion element is provided in part of the semiconductor layer on the opposite side of the transfer gate from the floating diffusion and stretches from the side-surface side of the transfer gate to a position under the bottom thereof.

16 Claims, 8 Drawing Sheets

SOLID-STATE IMAGING DEVICE

CROSS-REFERENCE TO RELATED APPLICATIONS

This application is based upon and claims the benefit of priority from Japanese Patent Application No. 2014-142397, filed on Jul. 10, 2014; the entire contents of which are incorporated herein by reference.

FIELD

Embodiments described herein relate generally to a solid-state imaging device.

BACKGROUND

Conventionally, there have been solid-state imaging devices wherein photoelectric conversion elements are formed along a depth direction of a semiconductor substrate so as to reduce the occupied area without decreasing the saturated electron number and wherein longitudinal transfer gates are embedded between the photoelectric conversion elements and floating diffusions so as to improve the charge transfer efficiency.

DETAILED DESCRIPTION

According to one embodiment, a solid-state imaging device is provided which includes a floating diffusion, a transfer gate, and a photoelectric conversion element. The floating diffusion is provided in a surface of a semiconductor layer. The transfer gate extends inward from the surface of the semiconductor layer and bends in the semiconductor layer toward the floating diffusion side. The photoelectric conversion element is provided in part of the semiconductor layer on the opposite side of the transfer gate from the floating diffusion and stretches from the side-surface side of the transfer gate to a position under the bottom thereof.

The solid-state imaging devices according to embodiments will be described in detail below with reference to the accompanying drawings. The present invention is not limited to these embodiments.

First Embodiment

Figure 1:
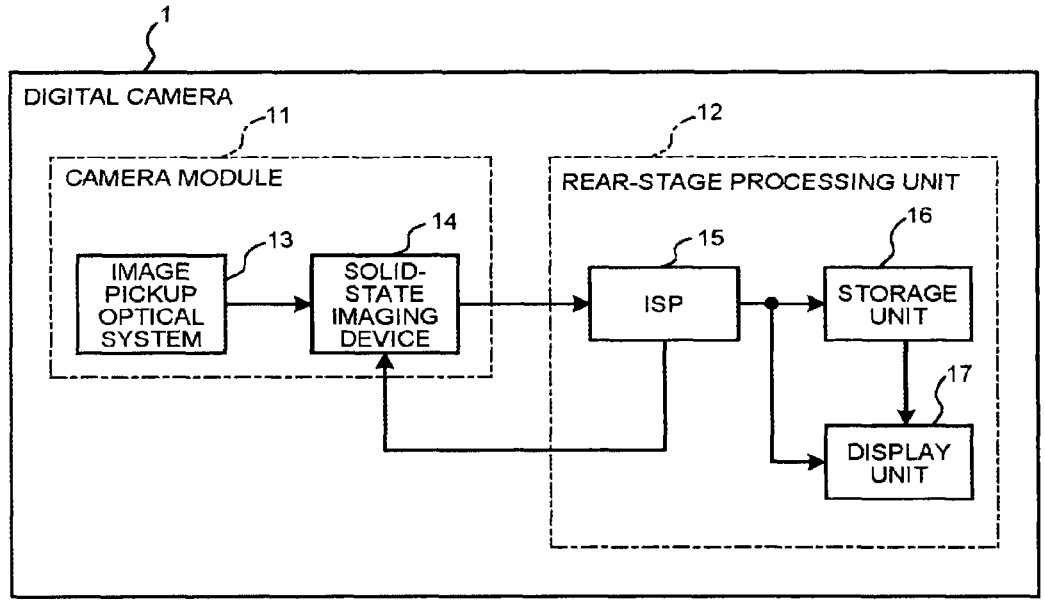
FIG. 1 is a block diagram showing schematically the configuration of a digital camera comprising a solid-state imaging device according to a first embodiment.

FIG. 1 is a block diagram showing schematically the configuration of a digital camera 1 comprising a solid-state imaging device 14 according to the first embodiment. As shown in FIG. 1, the digital camera 1 comprises a camera module 11 and a rear-stage processing unit 12.

The camera module 11 comprises an image pickup optical system 13 and the solid-state imaging device 14. The image pickup optical system 13 takes in light from an object to form an object image. The solid-state imaging device 14 captures the object image formed by the image pickup optical system 13 to output an image signal obtained by the image capture to the rear-stage processing unit 12. This camera module 11 is applied to an electronic device such as a mobile terminal with a camera, as well as the digital camera 1.

The rear-stage processing unit 12 comprises an ISP (Image Signal Processor) 15, a storage unit 16, and a display unit 17. The ISP 15 performs signal processing on the image signal inputted from the solid-state imaging device 14. The ISP 15 performs processes for higher image quality such as a noise removing process, a defective pixel correction process, a resolution conversion process, and the like.

The ISP 15 outputs the image signal after the signal processing to the storage unit 16, the display unit 17, and a later-described signal processing circuit 21 (see FIG. 2) provided in the solid-state imaging device 14 in the camera module 11. The image signal fed back from the ISP 15 to the camera module 11 is used in adjusting and controlling the solid-state imaging device 14.

The storage unit 16 stores the image signal inputted from the ISP 15 as an image. Further, the storage unit 16 outputs the image signal of the stored image to the display unit 17 according to a user's operation or the like. The display unit 17 displays an image according to the image signal inputted from the ISP 15 or the storage unit 16. The display unit 17 is, for example, a liquid crystal display.

Figure 2:
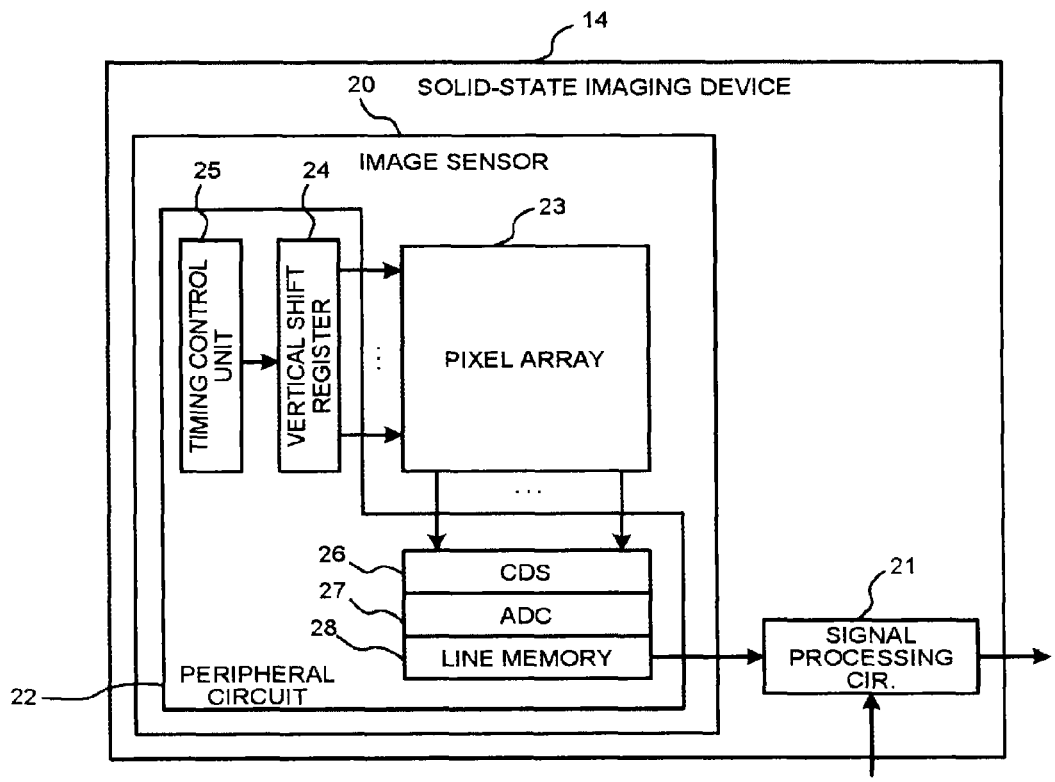
FIG. 2 is a block diagram showing schematically the configuration of the solid-state imaging device according to the first embodiment.

Next, the solid-state imaging device 14 that the camera module 11 comprises will be described with reference to FIG. 2. FIG. 2 is a block diagram showing schematically the configuration of the solid-state imaging device 14 according to the first embodiment. As shown in FIG. 2, the solid-state imaging device 14 comprises an image sensor 20 and the signal processing circuit 21.

Here, the case will be described where the image sensor 20 is a so-called backside irradiation-type CMOS (Complementary Metal Oxide Semiconductor) image sensor in which a wiring layer is formed on the side opposite to the light incident surface of photoelectric conversion elements photoelectrically converting incident light. The image sensor 20 according to this embodiment may be a front-side irradiation-type CMOS image sensor, not being limited to the backside irradiation-type CMOS image sensor.

The image sensor 20 comprises a peripheral circuit 22 and a pixel array 23. The peripheral circuit 22 comprises a vertical shift register 24, a timing control unit 25, a CDS (correlated double sampling unit) 26, an ADC (analog-to-digital converter) 27, and a line memory 28.

The pixel array 23 is provided in the image pickup area of the image sensor 20. In this pixel array 23, multiple photoelectric conversion elements corresponding to the pixels of a captured image are arranged in a two-dimensional array (in a matrix) along a horizontal direction (row direction) and a vertical direction (column direction). In the pixel array 23, the photoelectric conversion element corresponding to each pixel generates an amount of signal charge (e.g., electrons) according to the amount of incident light to store.

In the pixel array 23 of the present embodiment, photoelectric conversion elements are formed along a depth direction of a semiconductor substrate, and longitudinal transfer gates are embedded between the photoelectric conversion elements and floating diffusions so as to reduce the occupied area without decreasing the saturated electron number and to improve the charge transfer efficiency.

Further, in the pixel array 23, by adapting a novel design to the shapes of the longitudinal transfer gate and of the photoelectric conversion element in a semiconductor layer, the saturated electron number of the photoelectric conversion element is increased without increasing the occupied area. An example of this structure of the pixel array will be described later with reference to FIGS. 3A and 3B.

The timing control unit 25 is a processing unit that outputs a pulse signal as an operation timing reference to the vertical shift register 24. The vertical shift register 24 is a processing unit that outputs selection signals to the pixel array 23 so as to sequentially select photoelectric conversion elements from which to read signal charge on a per row basis from among multiple photoelectric conversion elements arranged two-dimensionally in an array (matrix).

The pixel array 23 outputs signal charge stored in each of photoelectric conversion elements selected on a per row basis by the selection signals inputted from the vertical shift register 24, as a pixel signal denoting the luminance of the corresponding pixel, from the photoelectric conversion element to the CDS 26.

The CDS 26 is a processing unit that removes noise from the pixel signals inputted from the pixel array 23 by correlated double sampling to output to the ADC 27. The ADC 27 is a processing unit that converts the analog pixel signals inputted from the CDS 26 into digital pixel signals to output to the line memory 28. The line memory 28 is a processing unit that temporarily holds the pixel signals inputted from the ADC 27 to output per row of photoelectric conversion elements in the pixel array 23 to the signal processing circuit 21.

The signal processing circuit 21 is a processing unit that performs predetermined signal processing on the pixel signals inputted from the line memory 28 to output to the rear-stage processing unit 12. The signal processing circuit 21 performs signal processing such as lens shading correction, scratch correction, and noise reduction processing on the pixel signals.

As such, in the image sensor 20, each of multiple photoelectric conversion elements arranged in the pixel array 23 photoelectrically converts incident light into an amount of signal charge according to the amount of received light to store, and the peripheral circuit 22 reads signal charge stored in each photoelectric conversion element as a pixel signal, thereby capturing an image.

Next, an example structure of the pixel array 23 according to the first embodiment will be described with reference to FIGS. 3A and 3B. Here, the structures of the photoelectric conversion element (hereinafter referred to as "PD"), the transfer gate (hereinafter referred to as "TG"), and the floating diffusion (hereinafter referred to as "FD") in the pixel array 23 will be described.

Figure 3A:
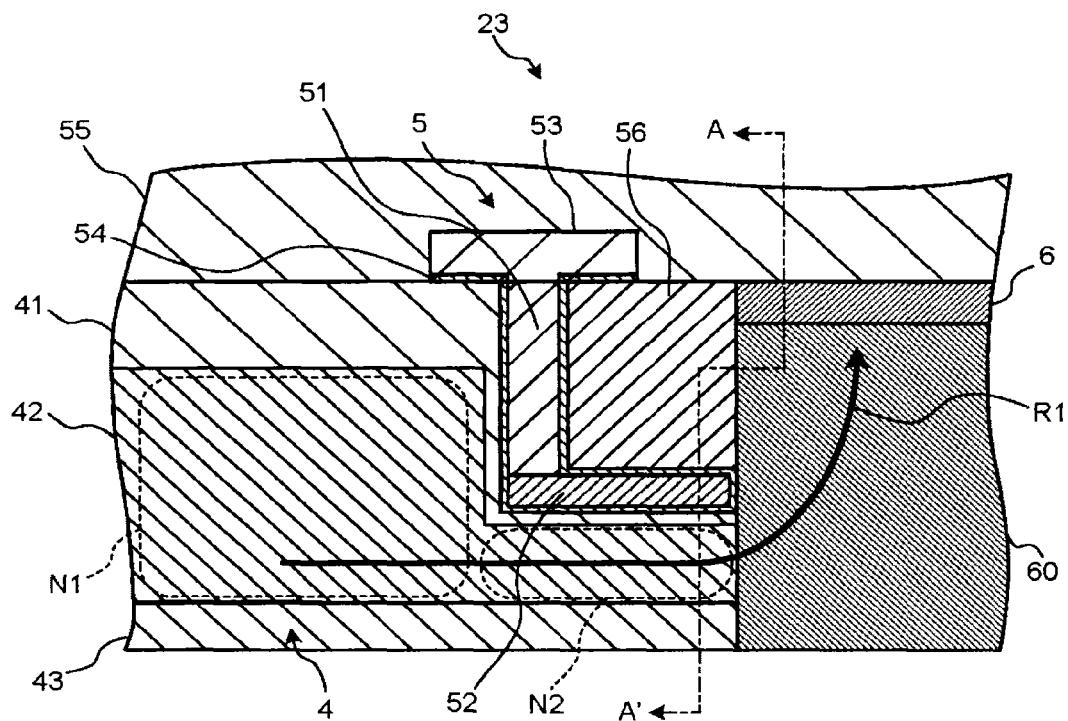
FIGS. 3A and 3B are illustrative diagrams showing schematically cross-sections of a pixel array according to the first embodiment.
Figure 3B:
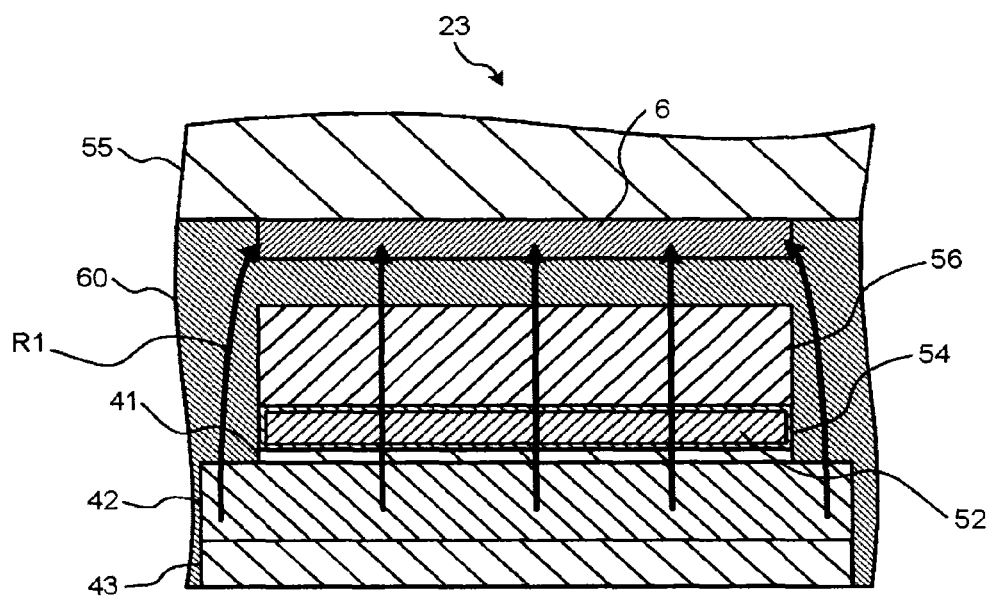

FIGS. 3A and 3B are illustrative diagrams showing schematically cross-sections of the pixel array 23 according to the first embodiment. FIG. 3A shows schematically a cross-section taken along a straight line joining a PD 4, a TG 5, and an FD 6, in plan view, of a part corresponding to a pixel of the pixel array 23, and FIG. 3B shows schematically a cross-section taken along line A-A' shown in FIG. 3A of the part corresponding to the pixel of the pixel array 23.

As shown in FIG. 3A, the pixel array 23 comprises the PD 4, TG 5, and FD 6. The TG 5 extends inward from the surface (here the top) of the semiconductor layer and bends in the semiconductor layer toward the FD 6 side.

This TG 5 includes a first gate portion 51, a second gate portion 52, and an electrode pad 53. The first gate portion 51 is provided to extend inward from the surface of the semiconductor layer and to touch, at the bottom end face, the upper surface of the proximal end of the second gate portion 52. In the example shown in FIG. 3A, the first gate portion 51 extends in a depth (vertical) direction with respect to the surface of the semiconductor layer.

The second gate portion 52 extends from the bottom of the first gate portion 51 in a different direction from the extending direction of the first gate portion 51. In the example shown in FIG. 3A, the second gate portion 52 extends in a horizontal direction with respect to the surface of the semiconductor layer or in a direction parallel to the electrode pad 53. The electrode pad 53 is provided to touch the end face of the first gate portion 51 on the front surface side of the semiconductor layer.

Although FIG. 3B illustrates the case where the angle formed by the extending direction of the first gate portion 51 and that of the second gate portion 52 is 90 degrees and where the TG 5 is shaped like an L in cross-sectional view, the angle formed by the extending direction of the first gate portion 51 and that of the second gate portion 52 is not limited to almost 90 degrees. That is, the TG 5 need only have a shape in which it extends inward from the surface of the semiconductor layer and bends in the semiconductor layer toward the FD 6 side.

The first gate portion 51, the second gate portion 52, and the electrode pad 53 are formed of conductive material such as polysilicon. The outer surfaces of the first gate portion 51 and of the second gate portion 52 are covered by an insulating film 54 formed of insulating material such as silicon oxide. This insulating film 54 functions a gate insulating film.

On the top of the semiconductor layer, there is provided an interlayer insulating film 55 formed of, e.g., TEOS (tetra-ethoxy silane). In this interlayer insulating film 55, multi-layer lines are provided.

The PD 4 is provided in part of the semiconductor layer on the opposite side of the TG 5 from the FD 6, stretching from the side-surface side of the TG 5 to a position under the bottom thereof. This PD 4 is a photodiode formed of a PN junction between a P-type semiconductor area 41 having a P-type impurity such as boron doped and an N-type semiconductor area 42 having an N-type impurity such as phosphorus doped.

An N-type semiconductor layer 43 lower in impurity concentration than the N-type semiconductor area 42 is provided under the bottom of the N-type semiconductor area 42. Although omitted from the figure, a protective film, a color filter, a micro-lens, and the like are provided below the bottom of the N-type semiconductor layer 43.

This PD 4 photoelectrically converts light incident from the N-type semiconductor layer 43 side into signal charge to store in the N-type semiconductor area 42 that is a charge storage area. The PD 4 according to the present embodiment is provided stretching from one side-surface side of the first gate portion 51 to a position under the bottom of the second gate portion 52.

Thus, the PD 4 can have a second region N2 located under the bottom of the second gate portion 52 as well as a first region N1 located on the one side-surface side of the first gate portion 51 in the N-type semiconductor area 42 function as the charge storage area.

Therefore, with the PD 4, the saturated electron number of the charge storage area can be increased without increasing the occupied area in plan view of the first region N1 by effectively utilizing the second region N2 as part of the charge storage area.

Further, in the pixel array 23, the FD 6 is provided on the opposite side of the TG 5 from the PD 4. This FD 6 is formed by doping the front side of a P-type epitaxial layer 60 having a P-type impurity such as boron doped therein with an N-type impurity such as phosphorus. Note that an insulating region 56 such as silicon oxide is provided between the first gate portion 51, and the FD 6 and the P-type epitaxial layer 60.

In this pixel array 23, if a predetermined voltage is applied to the TG 5, a channel is formed between the N-type semiconductor area 42 and the FD 6, and signal charge is transferred from the PD 4 to the FD 6 through a path R1 indicated by a thick arrow in FIGS. 3A and 3B.

While the N-type semiconductor area 42 in the PD 4 extends further toward the FD 6 side than the first gate portion 51, the second gate portion 52 is provided directly above the second region N2 that is its extension, so that a decrease in the transfer efficiency of signal charge can be suppressed.

As such, in the pixel array 23, the second gate portion 52 extends from the bottom of the first gate portion 51, a longitudinal transfer gate, toward the FD 6 side, and the PD 4 is provided stretching from the one side-surface side of the first gate portion 51 to a position under the bottom of the second gate portion 52.

Thus, with the pixel array 23 according to the first embodiment, the saturated electron number of the PD 4 can be increased without increasing the occupied area.

Next, a method of manufacturing the pixel array 23 according to the first embodiment will be described with reference to FIGS. 4A to 6C. FIGS. 4A to 6C are illustrative diagrams showing the production process for the pixel array 23 according to the first embodiment.

Figure 4A:
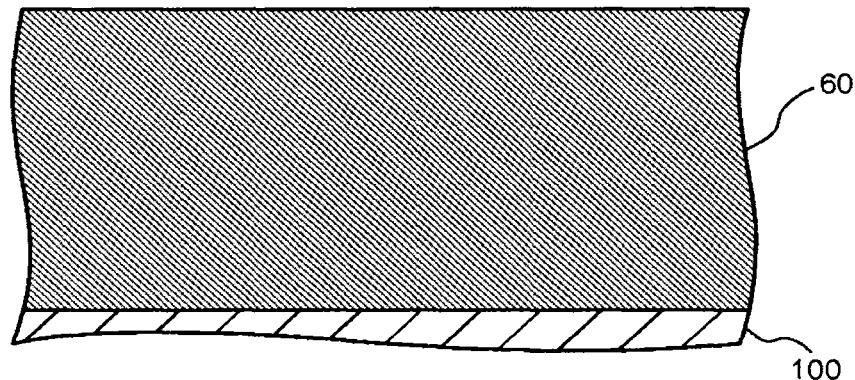
FIGS. 4A to 6C are illustrative diagrams showing the production process for the pixel array according to the first embodiment.
Figure 4B:
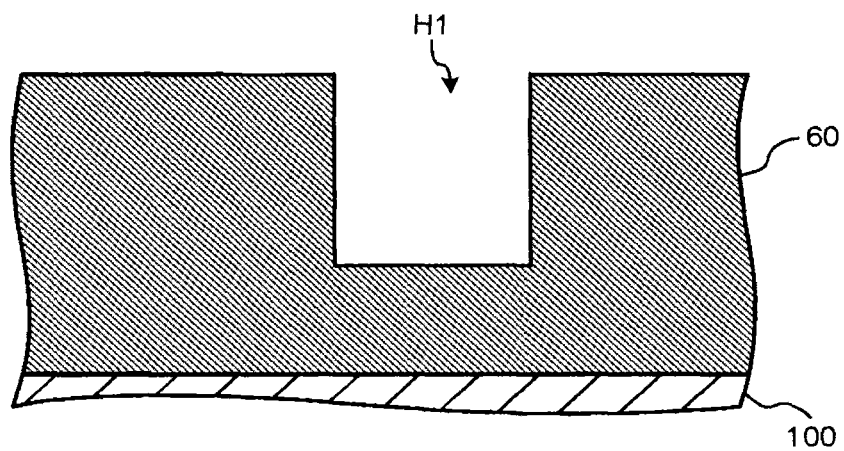

In manufacturing the pixel array 23, the P-type epitaxial layer 60 that is a semiconductor layer having a P-type impurity doped is formed on a surface of a semiconductor substrate 100 such as a silicon wafer as shown in FIG. 4A. Then, as shown in FIG. 4B, a hole H1 is formed at the position where the TG 5 is to be formed in the P-type epitaxial layer 60. Here, the hole H1 in a rectangular shape, in plan view, is formed.

Figure 4C:
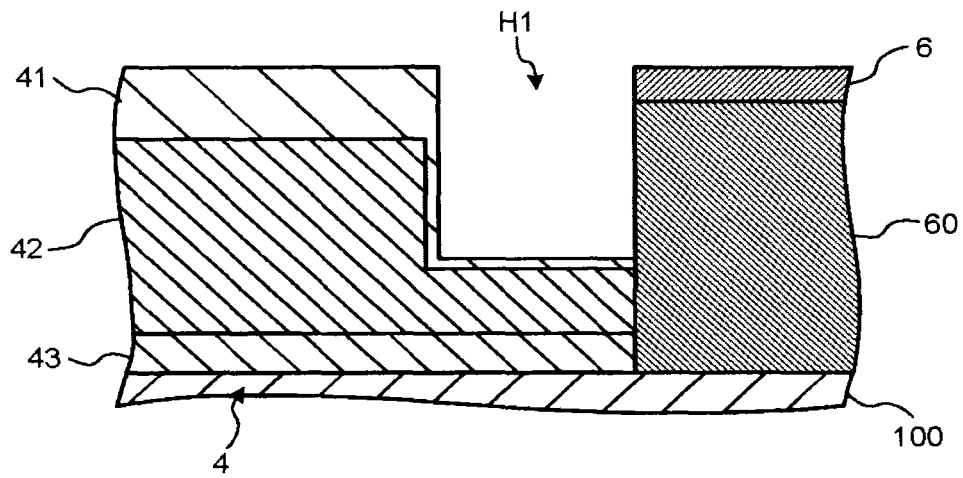

Then an N-type impurity is ion implanted through the surface of the side where the PD 4 is to be formed of the P-type epitaxial layer 60 and the bottom of the hole H1, and annealing is performed. Thus, the N-type semiconductor layer 43 is formed in the bottom of the side where the PD 4 is to be formed of the P-type epitaxial layer 60 as shown in FIG. 4C.

Then an N-type impurity and a P-type impurity are sequentially ion implanted at the position where the PD 4 is to be formed in the P-type epitaxial layer 60, and annealing is performed, so that the N-type semiconductor area 42 and the P-type semiconductor area 41 are formed. The N-type semiconductor area 42 is formed to have an N-type impurity concentration higher than that of the N-type semiconductor layer 43. Thus, the PD 4 is formed.

The P-type semiconductor area 41 is formed so as to cover the inner side surface on the side where the PD 4 is to be formed and bottom of the hole H1. As such, the P-type semiconductor area 41 is interposed between the hole H1 and the N-type semiconductor area 42, thereby suppressing the storage in the N-type semiconductor area 42 of electrons generated due to crystal defects in the inner side surfaces and bottom of the hole H1. Thus, the occurrence of a so-called white scratch in a captured image can be suppressed.

Then an N-type impurity is ion implanted at the position where the FD 6 is to be formed in the P-type epitaxial layer 60, and annealing is performed, so that the FD 6 is formed. Note that the order in which the N-type semiconductor layer 43, the N-type semiconductor area 42, the P-type semiconductor area 41, and the FD 6 are formed is not limited to the above order.

Figure 5A:
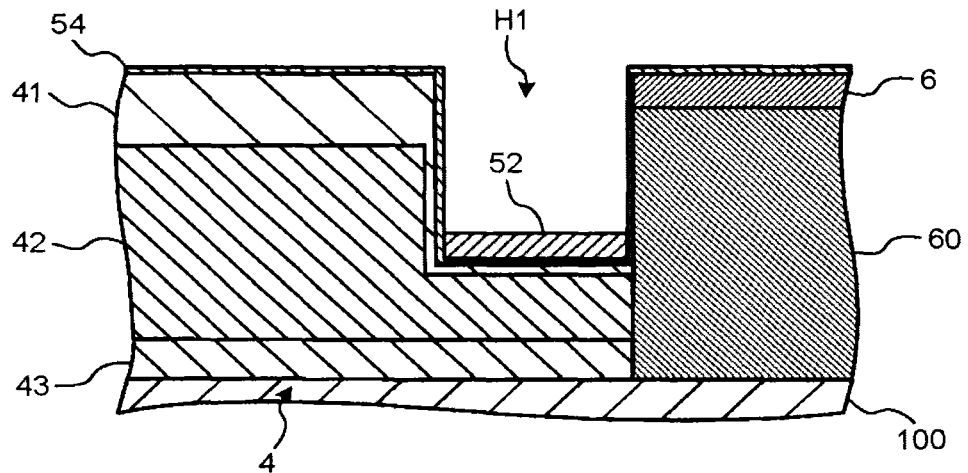

Then, as shown in FIG. 5A, an insulating film 54 of, e.g., silicon oxide is formed on the bottom and inner side surfaces of the hole H1 and the surfaces of the P-type semiconductor area 41 and the FD 6. Then by depositing, e.g., polysilicon over the bottom of the hole H1 covered by the insulating film 54, the second gate portion 52 is formed.

Figure 5B:
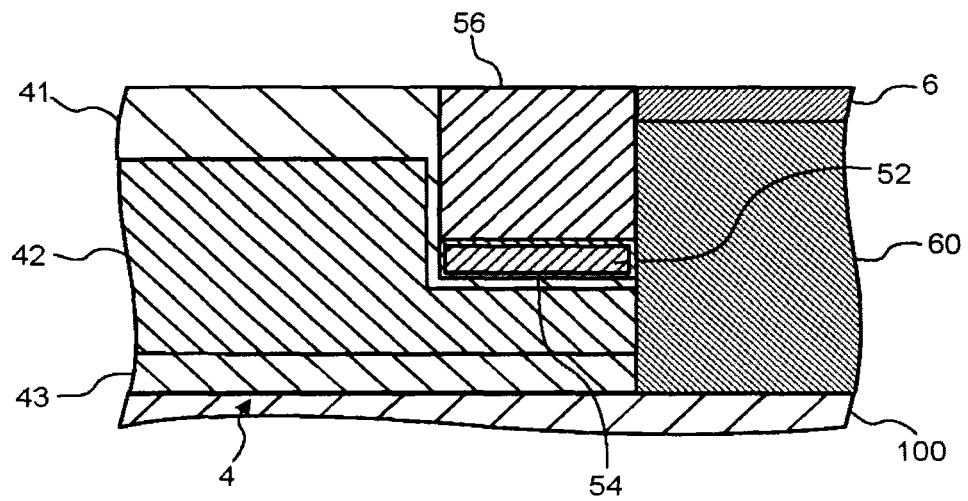

Then, as shown in FIG. 5B, after an insulating film 54 is formed on the top of the second gate portion 52, the parts of the insulating film 54 other than its part covering the second gate portion 52 is removed, and then by filling the hole H1 with, e.g., TEOS, the insulating region 56 is formed.

Figure 5C:
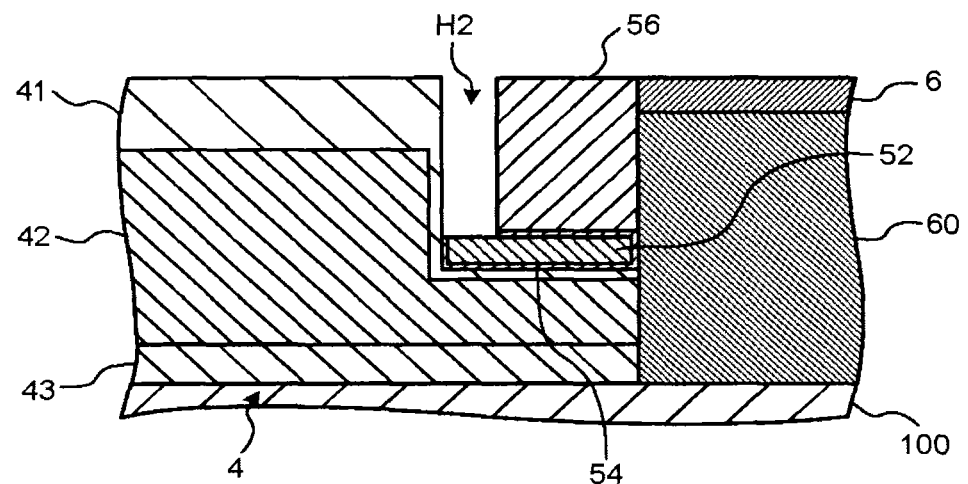

Then, as shown in FIG. 5C, a hole H2 in a rectangular shape, in plan view, is formed in the F-type semiconductor area 41 side of the insulating region 56, the hole H2 being smaller in width than the hole H1 formed previously. Thus, the interface of the P-type semiconductor area 41 with the insulating region 56 and part of the top of the second gate portion 52 are exposed.

Figure 6A:
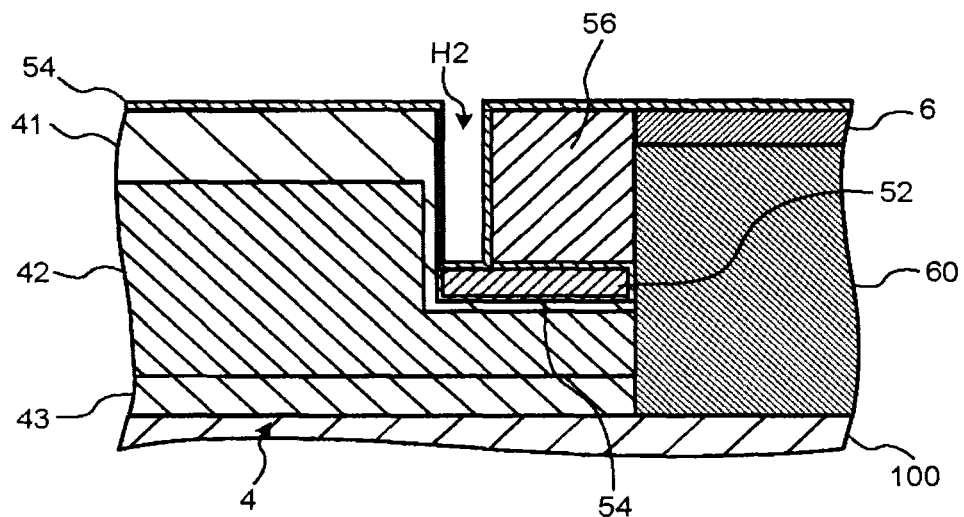

Subsequently, as shown in FIG. 6A, an insulating film 54 of, e.g., silicon oxide is formed over the surfaces of the P-type semiconductor area 41, the insulating region 56, and the FD 6, and the bottom and inner side surfaces of the hole H2.

Figure 6B:
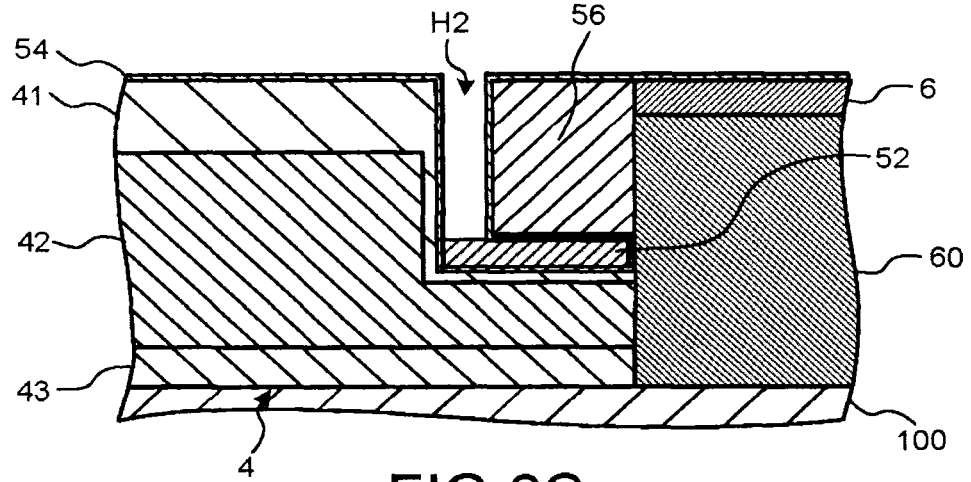
Figure 6C:
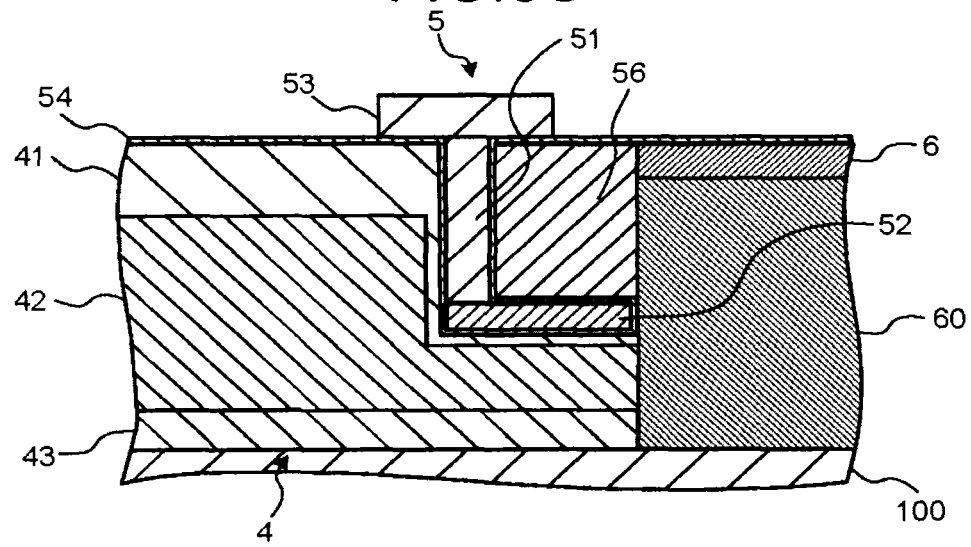

Then, as shown in FIG. 6B, part of the insulating film 54 covering the bottom of the hole H2 is selectively removed to make the surface of the second gate portion 52 partially exposed. Then, as shown in FIG. 6C, by filling the hole H2 with, e.g., polysilicon, the first gate portion 51 is formed, and the electrode pad 53 of, e.g., polysilicon is formed on the top of the first gate portion 51.

Then after unnecessary parts of the insulating film 54 on the P-type semiconductor area 41, the insulating region 56, and the FD 6 are removed, the interlayer insulating film 55 (see FIGS. 3A and 3B) is laid thereon. Then the semiconductor substrate 100 is ground and polished to make the N-type semiconductor layer 43 and the P-type epitaxial layer 60 exposed.

In this way, the pixel array 23 shown in FIGS. 3A and 3B is manufactured. The manufacturing method described herein is an example, and the method of manufacturing the pixel array 23 shown in FIGS. 3A and 3B is not limited to the above production process.

As described above, the TG 5 according to the first embodiment has a shape in which it extends inward from the surface of the semiconductor layer and bends in the semiconductor layer toward the FD 6 side. The PD 4 according to the first embodiment is provided in part of the semiconductor layer on the opposite side of the TG 5 from the FD 6 and has a shape in which it stretches from the side-surface side of the TG 5 to a position under the bottom thereof.

Thus, with the pixel array 23 according to the first embodiment, the saturated electron number of the PD 4 can be increased without increasing the occupied area because the region under the bottom of the TG 5 as well as the side-surface side of the TG 5 can be effectively utilized as the charge storage area of the PD 4.

Second Embodiment

Next, a solid-state imaging device according to the second embodiment will be described with reference to FIGS. 7 to 9.

The solid-state imaging device according to the second embodiment has the same configuration as the solid-state imaging device 14 according to the first embodiment except that it is different in the configuration of the pixel array. Hence, pixel arrays 23a, 23b according to the second embodiment will be described here.

Figure 7:
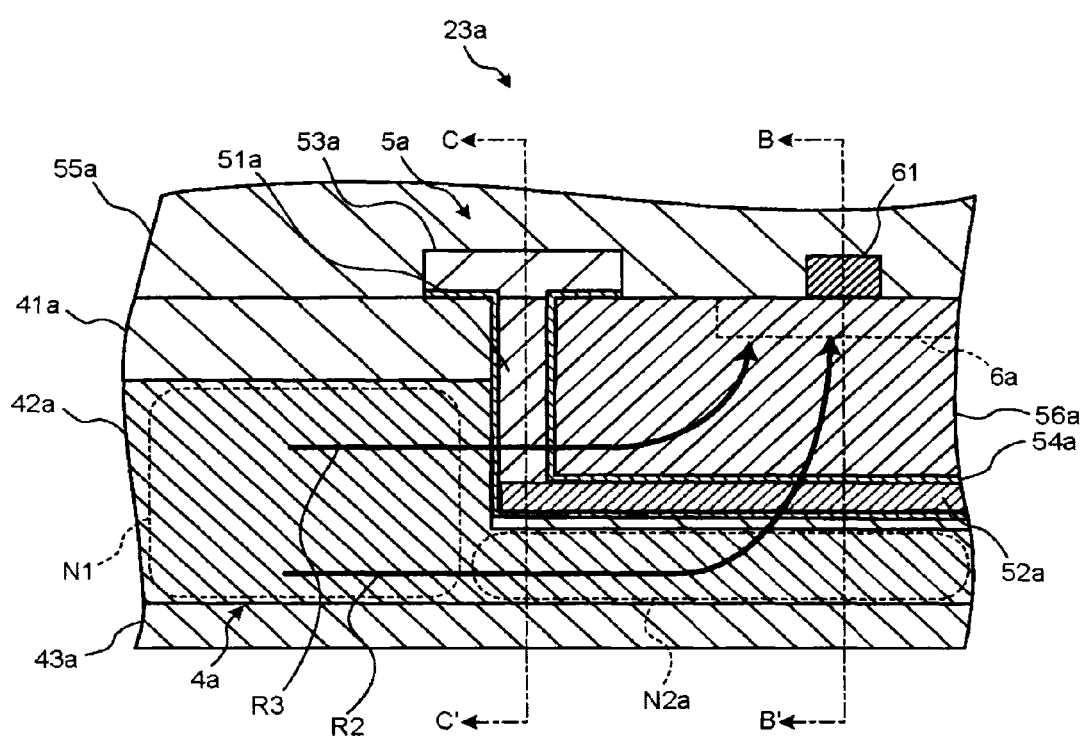
FIGS. 7, 8A, and 8B are illustrative diagrams showing schematically cross-sections of a pixel array according to a second embodiment.
Figure 8A:
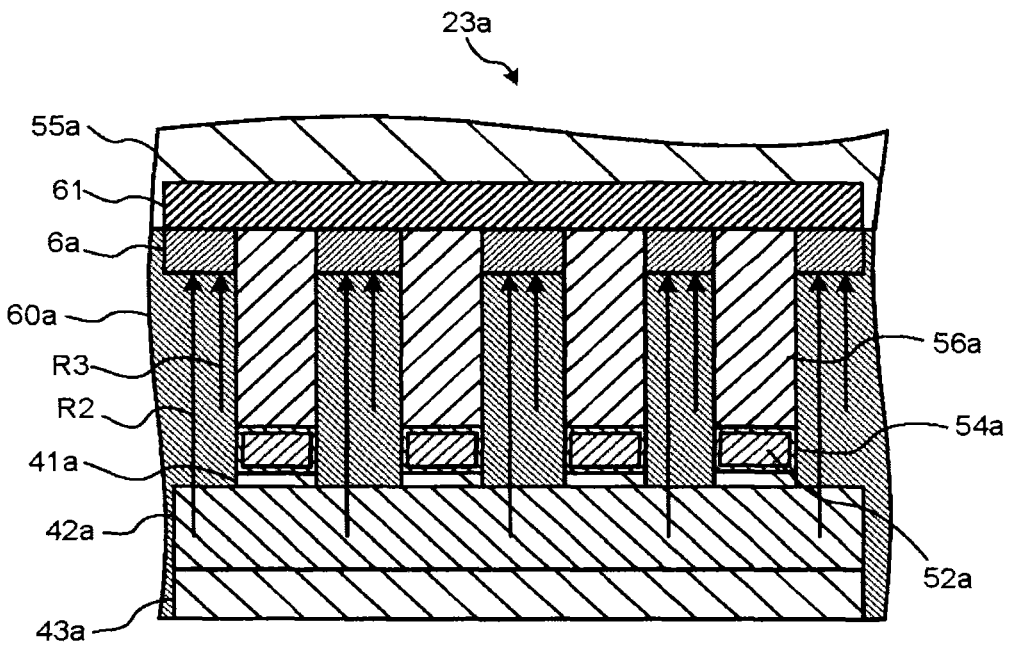
Figure 8B:
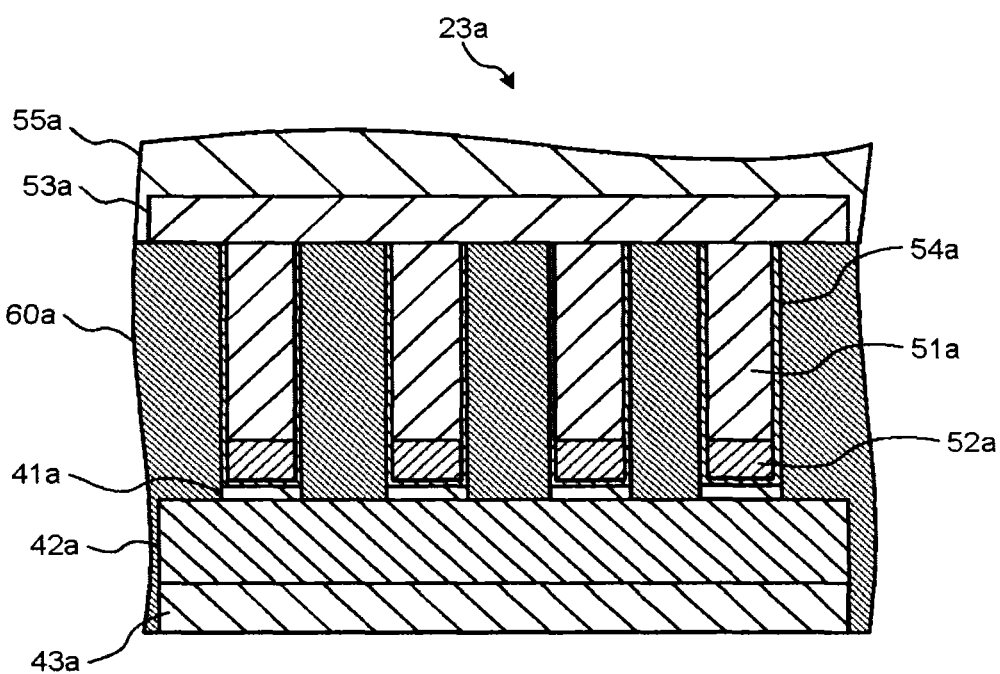
Figure 9:
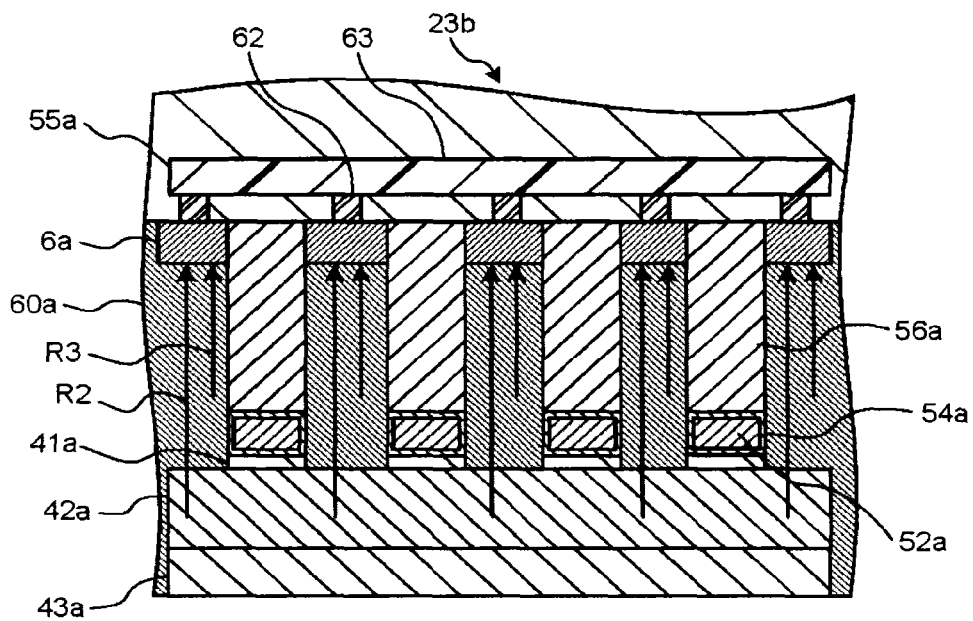
FIG. 9 is an illustrative diagram showing schematically a cross-section of a pixel array according to a modified example of the second embodiment.

FIGS. 7, 8A, and 8B are illustrative diagrams showing schematically cross-sections of the pixel array 23a according to the second embodiment, and FIG. 9 is an illustrative diagram showing schematically a cross-section of the pixel array 23b according to a modified example of the second embodiment.

In the description below, the same reference numerals as in FIGS. 3A and 3B with "a" attached to their ends are used to denote constituents formed of the same material and having the same function but different in shape from constituents of the pixel array 23 shown in FIGS. 3A and 3B from among the constituents of the pixel array 23a shown in FIGS. 7, 8A, and 8B and the pixel array 23b shown in FIG. 9, with a description of their materials and functions being omitted.

FIG. 7 shows schematically a cross-section taken along a straight line joining a PD 4a, a TG 5a, and an FD 6a, in plan view, of a part corresponding to a pixel of the pixel array 23a. FIG. 8A shows schematically a cross-section taken along line B-B' shown in FIG. 7 of the part corresponding to the pixel of the pixel array 23a. FIG. 8B shows schematically a cross-section taken along line C-C' shown in FIG. 7 of the part corresponding to the pixel of the pixel array 23a. The cross-section of the pixel array 23b shown in FIG. 9 is a cross-section of part corresponding to the cross-section of the pixel array 23a shown in FIG. 8A.

As shown in FIGS. 7, 8A, and 8B, in the pixel array 23a, the shapes of the PD 4a, TG 5a, and FD 6a are different than in the pixel array 23 according to the first embodiment. Accordingly, the shape of the insulating region 56 is changed, and in addition a connection 61 is provided on the FD 6a.

Specifically, as shown in FIG. 7, the tip of the second gate portion 52a of the TG 5a reaches further into the FD 6a side than the end on the first gate portion 51a side of the FD 6a in plan view. In the example shown in FIG. 7, the second gate portion 52a extends to such a position that it has an overlap with the FD 6a one above the other.

And the second region N2a of the PD 4a extends along the bottom of the second gate portion 52a to such a position that it has an overlap with the FD 6a one above the other. Thus, the saturated electron number further increases because the PD 4a has the second region N2a further extended.

As shown in FIGS. 7 and 8A, a plurality of the second gate portions 52a are formed in comb-tooth shapes which extend along a planar direction of the semiconductor layer. A plurality of the FDs 6a are provided in the surface of the semiconductor layer such that the FDs 6a and the comb-tooth shaped second gate portions 52a are alternately arranged in plan view.

Thus, in the pixel array 23a, if a predetermined voltage is applied to the TG 5a, signal charge stored in the PD 4a is transferred to the FDs 6a through paths running through between adjacent second gate portions 52a and through the side surfaces (paths R2 indicated by thick arrows in FIGS. 7 and 8A).

As shown in FIG. 8B, a plurality of the first gate portions 51a are formed in comb-tooth shapes which lead to the second gate portions 52a. Thus, in the pixel array 23a, if a predetermined voltage is applied to the TG 5a, signal charge stored in the PD 4a is transferred to the FDs 6a through paths running through between adjacent first gate portions 51a and through the side surfaces (paths R3 indicated by thick arrows in FIGS. 7 and 8A).

The FDs 6a are connected by the connection 61 extending over a row of the FDs 6a. The connection 61 is formed of a conductive material such as polysilicon. The way to connect the FDs 6a is not limited to this. The FDs 6a may be connected, for example, by embedding the connection 61 at the end on the opposite side of the FDs 6a from the first gate portions 51a.

Or a connecting line may be provided in the interlayer insulating film 55a so that the FDs 6a are connected by this line. In this case, for example, contact plugs 62 are provided on the floating diffusions 6a as in the pixel array 23b shown in FIG. 9, and the contact plugs 62 are connected by a connecting line 63 provided in the interlayer insulating film 55a. The contact plugs 62 are formed of, e.g., polysilicon. The line 63 is formed of, e.g., copper. Thus, the FDs 6a are connected.

In the pixel array 23a according to the second embodiment, the second gate portions 52a extend to such a position that they have an overlap with the FDs 6a in plan view, and the PD 4a extends along the bottom of the second gate portions 52a to such a position that it has an overlap with the FDs 6a in plan view. Thus, with the pixel array 23a according to the second embodiment, the saturated electron number of the PD 4a can be further increased without increasing the occupied area of the pixel array 23a.

Further, in the pixel array 23a according to the second embodiment, the first gate portions 51a and the second gate portions 52a are formed in comb-tooth shapes. Thus, in the pixel array 23a according to the second embodiment, signal charge can be transferred from the PD 4a to the FDs 6a through between adjacent first gate portions 51a and through the side surfaces, or through between adjacent second gate portions 52a and through the side surfaces, thus improving the transfer efficiency of signal charge.

Thus, with the pixel array 23a according to the second embodiment, signal charge which is not transferred from the N-type semiconductor area 42a to the FDs 6a but remains in the N-type semiconductor area 42a is reduced, so that the occurrence of a residual image in a captured image can be suppressed.

Third Embodiment

Next, a solid-state imaging device according to the third embodiment will be described with reference to FIG. 10. The solid-state imaging device according to the third embodiment has the same configuration as the solid-state imaging device according to the second embodiment except that it is different in the configuration of the PD. Hence, a PD 4b according to the third embodiment will be described here.

Figure 10:
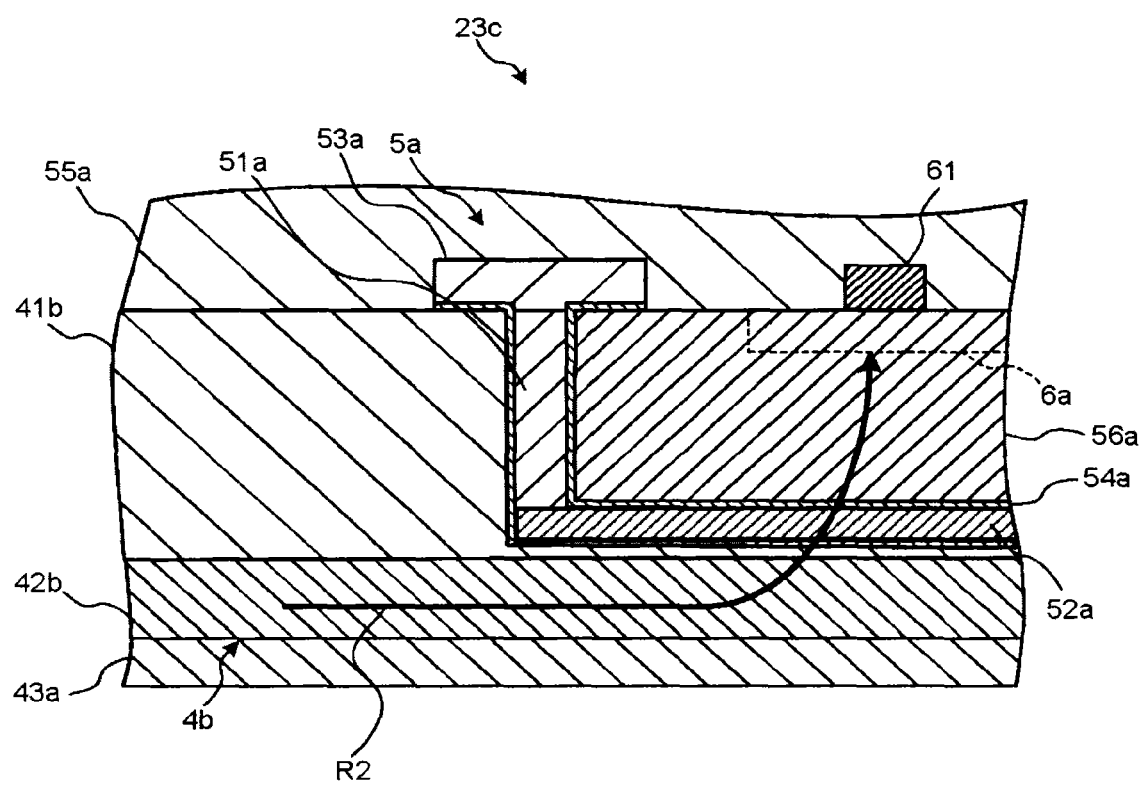
FIG. 10 is an illustrative diagram showing schematically a cross-section of a pixel array according to a third embodiment.

FIG. 10 is an illustrative diagram showing schematically a cross-section of a pixel array 23c according to the third embodiment. In the description below, the same reference numerals as in FIG. 7 are used to denote the same constituents as those of the pixel array 23a shown in FIG. 7 from among the constituents of the pixel array 23c shown in FIG. 10, with a description thereof being omitted.

Further, the reference numerals shown in FIG. 7 with "b" attached to their ends instead of "a" are used to denote constituents formed of the same material and having the same function but different in shape from constituents of the pixel array 23a shown in FIG. 7 from among the constituents of the pixel array 23c shown in FIG. 10, with a description of their materials and functions being omitted. FIG. 10 shows schematically a cross-section taken along a straight line joining a PD 4b, a TG 5a, and an FD 6a, in plan view, of a part corresponding to a pixel of the pixel array 23c.

As shown in FIG. 10, the PD 4b of the pixel array 23c comprises a P-type semiconductor area 41b stretching from the surface of the semiconductor layer more deeply than the bottom surface of the second gate portion 52a and a N-type semiconductor area 42b whose top is in contact with the bottom surface of the P-type semiconductor area 41b.

In this pixel array 23c, the interface between the P-type semiconductor area 41b and the interlayer insulating film 55a can be placed further away from the N-type semiconductor area 42b. Thus, with the pixel array 23c, the storage in the N-type semiconductor area 42b of electrons generated due to crystal defects in the surface of the P-type semiconductor area 41b can be suppressed, so that the occurrence of a white scratch in a captured image can be suppressed.

As described above, in the pixel array 23c according to the third embodiment, the PN junction between the P-type semiconductor area 41b and N-type semiconductor area 42b of the PD 4b is located deeper than the bottom surface of the TG 5a.

Thus, in the pixel array 23c according to the third embodiment, the N-type semiconductor area 42b of the PD 4b can be placed further away from the interface between the P-type semiconductor area 41b and the interlayer insulating film 55a.

Therefore, with the pixel array 23c according to the third embodiment, by suppressing the storage in the N-type semiconductor area 42b of electrons generated in the P-type semiconductor area 41b irrelevantly to the presence/absence of light, the occurrence of a white scratch in a captured image can be suppressed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid-state imaging device comprising:
a floating diffusion provided in a surface of a semiconductor layer;
a transfer gate extending inward from the surface of the semiconductor layer and bending in the semiconductor layer toward the floating diffusion side; and
a photoelectric conversion element provided in part of the semiconductor layer on the opposite side of the transfer gate from the floating diffusion and stretching from the side-surface side of the transfer gate to a position under the bottom thereof.

2. The solid-state imaging device according to claim 1, wherein the transfer gate comprises:
a first gate portion extending inward from the surface of the semiconductor layer; and
a comb-tooth-shaped second gate portion extending from the bottom of the first gate portion in a different direction from the extending direction of the first gate portion.

3. The solid-state imaging device according to claim 2, wherein the second gate portion extends along a planar direction of the semiconductor layer, so that the tip thereof reaches further into the floating diffusion side than the end on the first gate portion side of the floating diffusion in see-through plan view.

4. The solid-state imaging device according to claim 2, wherein a plurality of the first gate portions and a plurality of the second gate portions are formed in comb-tooth shapes.

5. The solid-state imaging device according to claim 4, wherein a plurality of the floating diffusions are provided in such a way that the floating diffusions and the comb-tooth shaped second gate portions are alternately arranged in see-through plan view.

6. The solid-state imaging device according to claim 5, comprising a connection connecting the plurality of the floating diffusions.

7. The solid-state imaging device according to claim 6, wherein the plurality of the floating diffusions are connected by the connection extending over a row of the floating diffusions arranged in a line.

8. The solid-state imaging device according to claim 6, wherein the plurality of the floating diffusions are connected by the connection embedded on the opposite side of the floating diffusions from the first gate portions.

9. The solid-state imaging device according to claim 5, comprising:
contact plugs provided on the plurality of the floating diffusions;
an interlayer insulating film provided on the semiconductor layer; and
a line provided in the interlayer insulating film to connect the contact plugs.

10. The solid-state imaging device according to claim 2, comprising an electrode pad touching an end face of the first gate portion, the end face being on the front surface side of the semiconductor layer.

11. The solid-state imaging device according to claim 2, wherein the photoelectric conversion element comprises:
a semiconductor area of a first conductivity type that extends from the surface of the semiconductor layer more deeply than the bottom surface of the second gate portion; and
a semiconductor area of a second conductivity type whose top is in contact with the bottom surface of the semiconductor area of the first conductivity type.

12. The solid-state imaging device according to claim 11, wherein the first conductivity type is a P type, and the second conductivity type is an N type, and
wherein the photoelectric conversion element has a planar PN junction located deeper in the semiconductor layer than the bottom surface of the transfer gate.

13. The solid-state imaging device according to claim 2, wherein the photoelectric conversion element comprises:
a first charge storage area located on one side-surface side of the first gate portion; and
a second charge storage area located under the bottom surface of the second gate portion.

14. The solid-state imaging device according to claim 13, wherein the second charge storage area extends along the bottom surface of the second gate portion to such a position that it has an overlap with the floating diffusion one above the other.

15. The solid-state imaging device according to claim 2, wherein the first gate portion extends in a thickness direction of the semiconductor layer, and the second gate portion extends in a direction perpendicular to the extension direction of the first gate portion.

16. The solid-state imaging device according to claim 1, wherein the transfer gate is coated on the outer surfaces with insulating material.

* * * * *